United States Patent
Buh et al.

(10) Patent No.: US 7,514,744 B2
(45) Date of Patent: Apr. 7, 2009

(54) SEMICONDUCTOR DEVICE INCLUDING CARRIER ACCUMULATION LAYERS

(75) Inventors: Gyoung-Ho Buh, Gyeonggi-do (KR); Yu-Gyun Shin, Gyeonggi-do (KR); Soo-Jin Hong, Gyeonggi-do (KR); Guk-Hyon Yon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 245 days.

(21) Appl. No.: 11/322,335

(22) Filed: Dec. 30, 2005

(65) Prior Publication Data
US 2006/0145254 A1    Jul. 6, 2006

(30) Foreign Application Priority Data
Jan. 5, 2005    (KR)    .............. 10-2005-0000936

(51) Int. Cl.
H01L 29/76    (2006.01)
H01L 29/94    (2006.01)
H01L 31/062    (2006.01)
H01L 31/113    (2006.01)
H01L 31/119    (2006.01)

(52) U.S. Cl. .............. 257/344; 257/408; 257/316; 257/321; 257/324

(58) Field of Classification Search ............... 257/316, 257/321, 324, 344, 408, 640, 649, 900
See application file for complete search history.

(56) References Cited

U.S. PATENT DOCUMENTS

| | | | |
|---|---|---|---|
| 4,873,557 A | 10/1989 | Kita | |
| 5,108,940 A | 4/1992 | Williams | |
| 6,630,712 B2 | 10/2003 | Yu | |
| 6,664,156 B1 * | 12/2003 | Ang et al. | 438/229 |

FOREIGN PATENT DOCUMENTS

| | | |
|---|---|---|
| JP | 05-003206 | 1/1993 |
| JP | 2000-106430 | 4/2000 |
| KR | 1998-029362 | 7/1998 |
| KR | 100257075 B1 | 2/2000 |
| KR | 1020020079267 | 10/2002 |
| KR | 1020030078205 A | 10/2003 |

* cited by examiner

*Primary Examiner*—Thien F Tran
(74) *Attorney, Agent, or Firm*—Myers Bigel Sibley & Sajovec, P.A.

(57) ABSTRACT

A semiconductor device includes a gate structure on a channel region of a semiconductor substrate adjacent to a source/drain region therein and a surface insulation layer directly on the source/drain region of the substrate adjacent to the gate structure. The device further includes a spacer on a sidewall of the gate structure adjacent to the source/drain region. A portion of the surface insulation layer adjacent the gate structure is sandwiched between the substrate and the spacer. An interface between the surface insulation layer and the source/drain region includes a plurality of interfacial states. Portions of the source/drain region immediately adjacent the interface define a carrier accumulation layer having a greater carrier concentration than other portions thereof. The carrier accumulation layer extends along the interface under the spacer. Related methods are also discussed.

17 Claims, 6 Drawing Sheets

Fig. 1

(Prior Art)

SEMICONDUCTOR DEVICE INCLUDING CARRIER ACCUMULATION LAYERS

CROSS-REFERENCE TO RELATED APPLICATIONS

This U.S. non-provisional patent application claims priority under 35 U.S.C. §119 from Korean Patent Application 10-2005-0000936 filed on Jan. 5, 2005, the disclosure of which is hereby incorporated by reference herein in its entirety. This application is also related to U.S. patent application Ser. No. 11/215,217, filed on Aug. 30, 2005, the disclosure of which is also incorporated by reference herein in its entirety.

FIELD OF THE INVENTION

The present invention relates to a semiconductor devices and, more particularly, to field-effect transistor devices (FETs) and methods for forming the same.

BACKGROUND OF THE INVENTION

A conventional MOS transistor may include a gate pattern formed on a semiconductor substrate, a channel region defined below the gate pattern, and source/drain regions formed in the semiconductor substrate on both sides of the channel region. Generally, the source/drain regions may include a lightly doped drain (LDD) structure for example, to reduce and/or suppress hot carrier effects. More specifically, by lowering the impurity concentration of the source/drain regions adjacent to a channel region, the electric field concentration may be reduced, which may suppress hot carrier effects.

Figure 1:
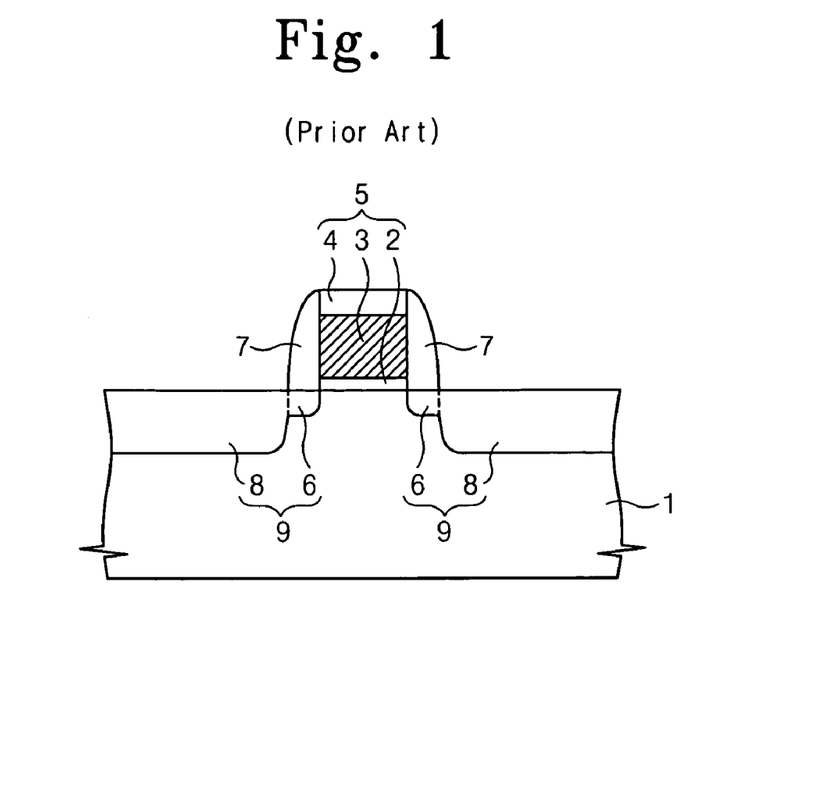
FIG. 1 is a cross-sectional view of a conventional MOS transistor.

A method for forming a conventional MOS transistor will now be described with reference to FIG. 1. As illustrated in FIG. 1, a gate pattern 5 is formed on a semiconductor substrate 1. The gate pattern 5 includes a gate oxide layer 2, a gate electrode 3, and a capping pattern 4, which may be sequentially stacked. The substrate 1 below the gate pattern 5 is defined as a channel region. Using the gate pattern 5 as a mask, impurities may be implanted at a relatively low dose to form a lightly doped layer 6.

A gate spacer 7 may be formed on opposing sidewalls of the gate pattern 5. Using the gate pattern 5 and the gate spacer 7 as a mask, impurities may be implanted at a relatively high dose to form a heavily doped layer 8. Since the lightly doped layer 6 may have a shallower junction than the heavily doped doping layer 8, the source/drain region 9 formed at both sides of the channel region may have a lightly-doped drain (LDD) structure, including the lightly and heavily doped layers 6 and 8.

In recent years, there has been demand for semiconductor devices with increasingly high operating speeds. As such, MOS transistors with increased on-current have been provided. However, MOS transistors including the above LDD structure may suffer from decreased on-current, due to the relatively high resistance of the lightly doped layer 6.

Many efforts have been made to increase on-current in MOS transistors. For example, the lightly doped layer 6 may be doped to have an impurity concentration similar to that of the heavily doped layer 8. However, as the impurity concentration of the lightly doped layer 6 increases, the junction depth of the lightly doped layer 6 may increase, due to diffusion of the impurities. Thus, short channel effects may become severe enough to degrade characteristics of the MOS transistor.

SUMMARY OF THE INVENTION

Embodiments of the present invention are directed to semiconductor devices and methods for forming the same. In some embodiments, the semiconductor device may include a gate pattern disposed on a semiconductor substrate doped with impurities of a first conduction type; a gate spacer disposed on both sidewalls of the gate pattern; a surface insulation layer sandwiched between the gate spacer and the semiconductor substrate to contact the semiconductor substrate; a lightly doped layer doped with impurities of a second conduction type and disposed in the semiconductor substrate below the gate spacer; and a carrier accumulating layer disposed at an upper portion of the lightly doped layer. The surface insulation layer may lead to the presence of interfacial states at an interface between the surface insulation layer and the semiconductor substrate, and the interfacial states may induce majority carriers in the lightly doped layer to form the carrier accumulating layer.

In other embodiments, the method may include forming a gate pattern on a semiconductor substrate doped with impurities of a first conduction type; implanting impurities of a second conduction type at a low dose, using the gate pattern as a mask, to form a lightly doped layer; conformally forming a surface insulation layer to contact the semiconductor substrate at opposite sides adjacent to the gate pattern; and forming a gate spacer on both sidewalls of the gate pattern. The surface insulation layer may lead to the presence of interfacial states at an interface between the surface insulation layer and the semiconductor substrate, and the interfacial states may induce majority carriers in the lightly doped layer to form a carrier accumulating layer at an upper portion of the lightly doped layer.

According to some embodiments of the present invention, a semiconductor device may include a gate structure on a channel region of a semiconductor substrate adjacent to a source/drain region therein, a surface insulation layer directly on the source/drain region of the substrate adjacent to the gate structure, and a spacer on a sidewall of the gate structure adjacent to the source/drain region. A portion of the surface insulation layer adjacent the gate structure may be sandwiched between the substrate and the spacer. An interface between the surface insulation layer and the source/drain region may include a plurality of interfacial states. Portions of the source/drain region immediately adjacent the interface may define a carrier accumulation layer having a greater carrier concentration than other portions thereof. The carrier accumulation layer may extend along the interface under the spacer.

In other embodiments, the source/drain region may include a first region adjacent the channel region, and a second region adjacent the first region opposite the channel region and extending into the substrate beyond the first region. The second region may have a greater impurity concentration than the first region.

In some embodiments, the carrier accumulation layer may extend away from the channel region along the interface from a portion of the first region immediately adjacent the channel region into the second region. Portions of the carrier accumulation layer in the second region may have a greater carrier concentration than portions of the carrier accumulation layer in the first region.

In other embodiments, the carrier accumulation layer may extend away from the channel region along the interface into the first region, but may not extend beyond the spacer.

In some embodiments, the surface insulation layer may extend on a sidewall of the gate structure and may be sandwiched between the gate structure and the spacer. The spacer may be formed of an insulating material having a lower dielectric constant than silicon nitride.

In other embodiments, the semiconductor substrate may be a p-type substrate, and the source/drain region may be a n-type source/drain region. The surface insulation layer may include hafnium oxide, zirconium oxide, and/or silicon nitride.

In some embodiments, the semiconductor substrate may be an n-type substrate, and the source/drain region may be a p-type source/drain region. The surface insulation layer may include aluminum oxide.

In other embodiments, the gate structure may include a floating gate and a control gate.

According to further embodiments of the present invention, a method of fabricating a semiconductor device on a semiconductor substrate may include forming a gate structure on the substrate, forming a source/drain region in the substrate adjacent the gate structure, and forming a surface insulation layer directly on the source/drain region adjacent to the gate structure. A spacer may be formed on a sidewall of the gate structure adjacent to the source/drain region to sandwich portions of the surface insulation layer adjacent the gate structure a between the substrate and the spacer. A plurality of interfacial states may be defined at an interface between the surface insulation layer and the source/drain region. Portions of the source/drain region that are immediately adjacent the interface may define a carrier accumulation layer extending along the interface under the spacer and having a greater carrier concentration than other portions thereof.

In other embodiments, the source/drain region may be formed prior to forming the spacer by implanting impurities of a different conductive type than the substrate into the substrate using the gate structure as a mask.

In some embodiments, the source/drain region may be a first portion of the source/drain region. Impurities may be implanted into the substrate using the gate structure and the spacer as a mask to define a second portion of the source/drain region adjacent the first portion of the source/drain region opposite the gate structure and extending into the substrate beyond the first portion of the source/drain region. The second portion of the source/drain region may have a greater impurity concentration than the first portion thereof.

In other embodiments, the carrier accumulation layer may extend away from the gate structure along the interface from the first portion of the source/drain region adjacent the gate structure into the second portion of the source/drain region. Portions of the carrier accumulation layer in the second portion of the source/drain region may have a greater carrier concentration than portions of the carrier accumulation layer in the first portion of the source/drain region.

In some embodiments, the carrier accumulation layer may extend away from the gate structure along the interface into the first portion of the source/drain region, but may not extend beyond the spacer.

In other embodiments, the semiconductor substrate may be a p-type substrate, and the source/drain region may be a n-type source/drain region. The surface insulation layer may include hafnium oxide, zirconium oxide, and/or silicon nitride.

In some embodiments, the semiconductor substrate may be an n-type substrate, and the source/drain region may be a p-type source/drain region. The surface insulation layer may include aluminum oxide.

In other embodiments, the gate structure may be formed by forming a first insulating layer on the substrate, forming a floating gate electrode on the first insulating layer, forming a second insulating layer on the floating gate, and forming a control gate on the second insulating layer.

According to still further embodiments of the present invention, a method of fabricating a semiconductor device on a semiconductor substrate may include forming a gate structure on the substrate and implanting impurities of a different conductive type than the substrate into the substrate on opposite sides of the gate structure using the gate structure as a mask to define first and second source/drain regions. A surface insulation layer may be formed directly on the first and second source/drain regions on opposite sides of the gate structure. Spacer may be formed on opposing sidewalls of the gate structure adjacent to the first and second source/drain regions to sandwich portions of the surface insulation layer adjacent the gate structure a between the substrate and the spacers. Portions of the first and second source/drain region that are immediately adjacent an interface between the surface insulation layer and the first and second source/drain regions may have a greater carrier concentration than other portions thereof.

DETAILED DESCRIPTION OF EMBODIMENTS OF THE INVENTION

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "under," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" or "under" other elements would then be oriented "above" or "over" the other elements. The exemplary terms "below" or "beneath" or "under" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

Figure 2:
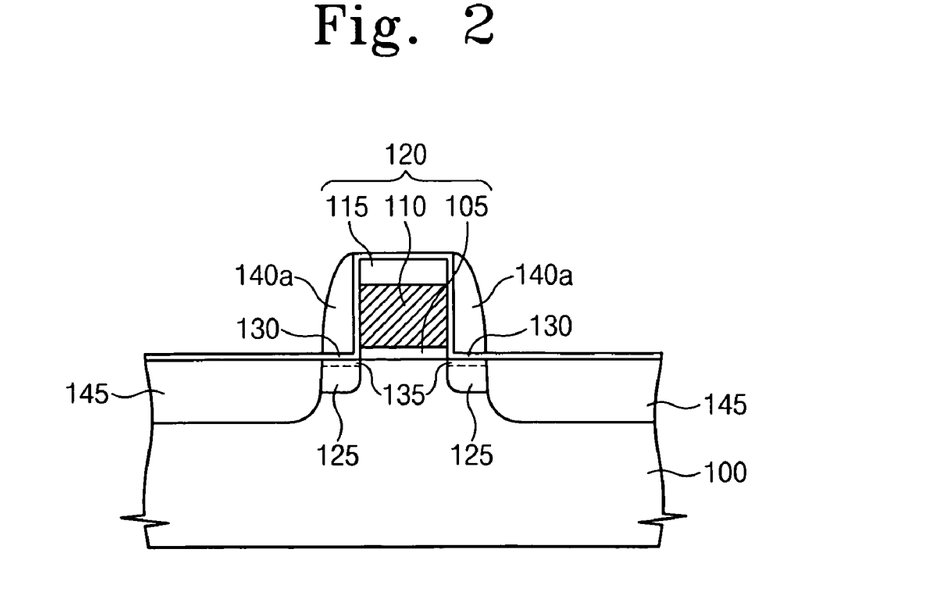
FIG. 2 is a cross-sectional view of a semiconductor device according to some embodiments of the present invention.

FIG. 2 is a cross-sectional view of a semiconductor device according to some embodiments of the present invention.

As illustrated in FIG. 2, a gate pattern 120 is disposed on a semiconductor substrate 100. The semiconductor substrate 100 is doped with impurities of a first conductive type, for example, p-type impurities. The gate pattern 120 includes an insulation layer 105, a gate electrode 110, and a capping pattern 115, which are stacked. The gate insulation layer 105 may be a thermal oxide layer. In addition, the gate insulation layer 105 may be a relatively high-k dielectric layer having a higher dielectric constant than silicon oxide. The gate electrode 110 may be a conductive layer, which may include doped polysilicon, metal (e.g., tungsten or molybdenum), conductive metal nitride (e.g., titanium nitride or tantalum nitride), metal silicide (e.g., tungsten silicide, cobalt silicide, nickel silicide, titanium silicide, etc.), and/or combinations thereof. The capping pattern 115 may be an insulation layer, which may include silicon oxide, silicon nitride, and/or silicon oxynitride.

A gate spacer 140a is disposed at opposing sidewalls of the gate pattern 120. A lightly doped layer 125 is formed in the substrate 100 below the gate spacer 140a. The lightly doped layer 125 may be doped with impurities of a second conductive type that is different from the first conduction type, for example, n-type impurities. Accordingly, the lightly doped layer 125 and the semiconductor substrate 100 may form a PN junction.

The gate spacer 140a covers the lightly doped layer 125. A surface insulation layer 130 is sandwiched between the gate spacer 140a and the substrate 100, directly contacting the substrate 100 and covering the lightly doped layer 125.

The surface insulation layer 130 leads to the presence of interfacial states at an interface between the surface insulation layer 130 and the substrate 100. The interfacial states may induce majority carriers in the lightly doped layer 125 to form a carrier accumulating layer 135 at an upper portion of the lightly doped layer 125. The carrier accumulating layer 135 may be formed directly below a surface of the substrate 100. The carrier accumulating layer 135 has a higher carrier concentration and/or density than the other portions the lightly doped layer 125.

Because of the interfacial states, the energy band of an upper portion of an adjacent lightly doped layer 125 may be bent so that the majority carriers of the lightly doped layer 125 may accumulate at the upper portion thereof. The carrier density of the carrier accumulating layer 135 may be dependent upon the density of the interfacial states. In other words, the carrier concentration/density of the carrier accumulating layer 125 may increase with an increase in the density of the interfacial states. The density of the interfacial states may be independent of the thickness of the surface insulation layer 130. Thus, the surface insulation layer 130 may have a relatively small thickness, ranging from about several angstroms to about several dozens angstroms.

For example, if the substrate 100 is doped with P-type impurities and the lightly doped layer 125 is doped with N-type impurities, the surface insulation layer 130 may lead to the presence of interfacial states that may induce electrons (i.e., the majority carriers in the lightly doped layer 125) to form the carrier accumulating layer 135. Accordingly, the electron density of the carrier accumulating layer 135 may be relatively high. The surface insulation layer 130 may include hafnium-rich hafnium oxide, zirconium-rich zirconium oxide, and/or silicon nitride. In particular, the greater the concentration of hafnium in the hafnium oxide, the higher the density of the interfacial states. Similarly, the greater the concentration of zirconium in the zirconium oxide, the higher the density of the interfacial states. Therefore, the surface insulation layer 130 may include hafnium-rich hafnium oxide or zirconium-rich zirconium oxide to increase the density of the interfacial states. As a result, the electron density of the carrier accumulating layer 135 may be increased.

On the other hand, if the substrate 100 is doped with N-type impurities and the lightly doped layer 125 is doped with P-type impurities, the surface insulation layer 130 may lead to the presence of interfacial states that may induce holes (i.e., the majority carriers of the lightly doped layer 125) to form the carrier accumulating layer 135. Thus, holes may be accumulated in the carrier accumulating layer 135. The surface insulation layer 130 may include aluminum-rich aluminum oxide. The greater the concentration of aluminum in the aluminum oxides, the higher the density of the interfacial states. Accordingly, the surface insulation layer 130 may include aluminum-rich aluminum oxide to increase the density of the interfacial states. As a result, the hole density of the carrier accumulating layer 135 may be increased.

The surface insulation layer 130 may be sandwiched between the gate pattern 120 and the gate spacer 140a. In addition, the surface insulation layer 130 may extend on opposing sidewalls and/or a top/upper surface of the gate pattern 120.

A heavily doped layer 145 is formed in the semiconductor substrate 100 at one side of each lightly doped layer 125. Thus, the lightly doped layer 125 is sandwiched between the gate pattern 120 and the heavily doped layer 145. The heavily doped layer 145 is doped with impurities of the same conductive type as the lightly doped layer 125. Accordingly, the lightly doped layer 125 is electrically connected with the heavily doped layer 145. Also the carrier accumulating layer 135 is electrically connected with the heavily doped layer 145. The heavily doped layer 145 has a higher impurity concentration than the lightly doped layer 125. The lightly doped layer 125 has a shallower junction than the heavily doped layer 145.

The surface insulation layer 130 extends on the surface of the substrate 100 on the heavily doped layer 145. Although not shown in FIG. 2, the carrier accumulating layer 135 may extend into an upper portion of the heavily doped layer 145 below the surface insulation layer 130. The portion of the carrier accumulating layer 135 extending into the heavily doped layer 145 may have a higher carrier concentration than the portion of the carrier accumulating layer 135 extending into the lightly doped layer 125.

The lightly and heavily doped layers 125 and 145 form source/drain regions. As such, the gate pattern 120, a channel region formed in the substrate 100 below the gate pattern 120, and the source/drain regions form a MOS transistor.

The gate spacer 140a is formed of an insulating material having a lower dielectric constant than silicon nitride. Additionally, the gate spacer 140a may be formed of an insulating material having the same dielectric constant as silicon oxide or having a lower dielectric constant than silicon oxide. The gate spacer 140a may include, for example, silicon oxide, silicon carbide, and/or silicon oxycarbide.

In the above-described MOS transistor, a carrier accumulating layer 135 having a relatively high carrier concentration/density is formed at an upper portion of the lightly doped layer 125. Accordingly, a resistance of the upper portion of the lightly doped layer 125 can be reduced, which may increase the on-current of the MOS transistor. The formation of the carrier accumulating layer 135 may be induced by the interfacial states resulting from formation of the surface insulation layer 130. As a result, although the density of the lightly doped layer 125 may decrease, the on-current of the MOS transistor may increase due to the reduced resistance of the carrier accumulating layer 135 induced by the interfacial states.

Accordingly, the impurity concentration of the lightly doped layer 125 may be reduced to suppress short channel effects and the on-current of the MOS transistor may be increased due to the carrier accumulating layer 135. As such, a semiconductor device with higher operating speeds may be provided.

Moreover, the gate spacer 140a is formed of an insulating material having a relatively low dielectric constant. Thus, parasitic capacitance between the gate pattern 120 and the source/drain regions and/or between a neighboring gate pattern may be reduced to improve operating speed of a semiconductor device, according to embodiments of the present invention.

A simulation was conducted to confirm the formation of the carrier accumulating layer 135 due to the surface insulation layer 130. Data associated with the simulation results are shown in FIG. 3.

Figure 3:
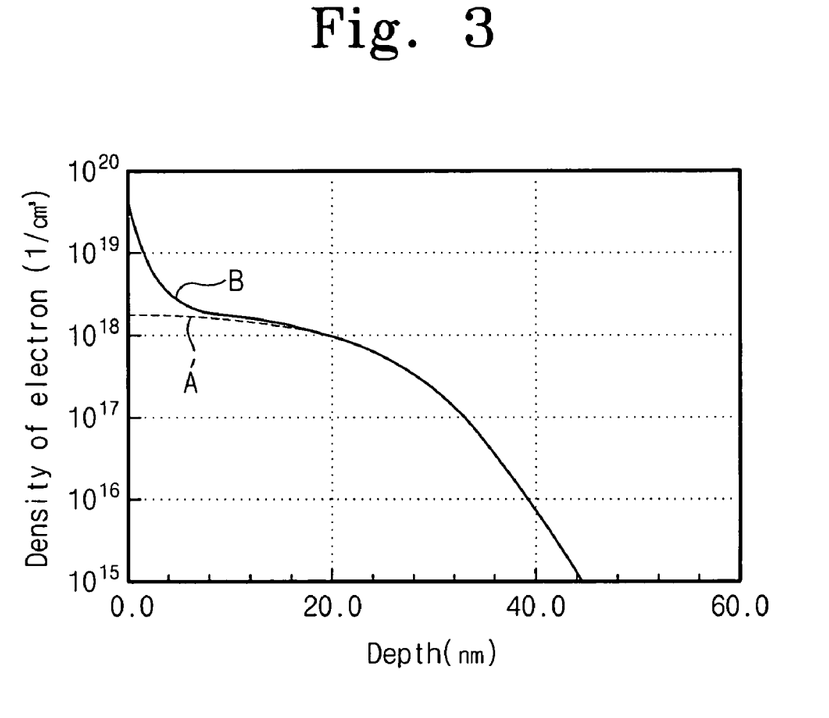
FIG. 3 is a graph illustrating carrier distribution in a lightly doped layer in a conventional transistor as compared to carrier distribution in a lightly doped layer according to some embodiments of the present invention.

FIG. 3 is a graph illustrating carrier distribution in a lightly doped layer in a conventional transistor as compared to carrier distribution in a lightly doped layer according to some embodiments of the present invention, such as the lightly doped layer 125 of FIG. 2. In the graph, the x-axis represents a depth from a surface of a semiconductor substrate, and the y-axis represents the electron density.

Referring to FIG. 2 and FIG. 3, data for two samples 1 and 2 used in the simulation are denoted by a dotted line A and a solid line B, respectively. Sample 1 was obtained by implanting arsenic ions into a silicon substrate at a dose of $1E13/cm^2$, corresponding to a conventional lightly doped layer. Sample 2 was obtained by implanting arsenic ions at a dose of $1E13/cm^2$ into a silicon substrate including a silicon nitride surface insulation layer 13 that contacts the silicon substrate and has a thickness of about 10 angstroms, corresponding to the lightly doped layer 125 according to some embodiments of the present invention.

As shown by dotted line A, the electron density of sample 1 is nearly uniform from a depth of about 20 nanometers to a surface of a silicon substrate. Meanwhile, as shown by solid line B, the electron density of sample 2 increases rapidly from a depth of about 4 nanometers to the surface of the substrate. More particularly, at the surface of the silicon substrate, the electron density of sample 1 is about 25 times greater than that of sample 2. Accordingly, solid line B of FIG. 3 illustrates that a carrier accumulating layer 135 having a relatively higher carrier concentration is formed at an upper portion of the lightly doped layer 125. As a result, the upper portion of the lightly doped layer 125 may have a relatively low resistance.

The source/drain regions include the lightly doped layer 125 and the heavily doped layer 145. However, in other embodiments of the present invention, the source/drain region may include only the lightly doped layer 125, as described below with reference to FIG. 4.

Figure 4:
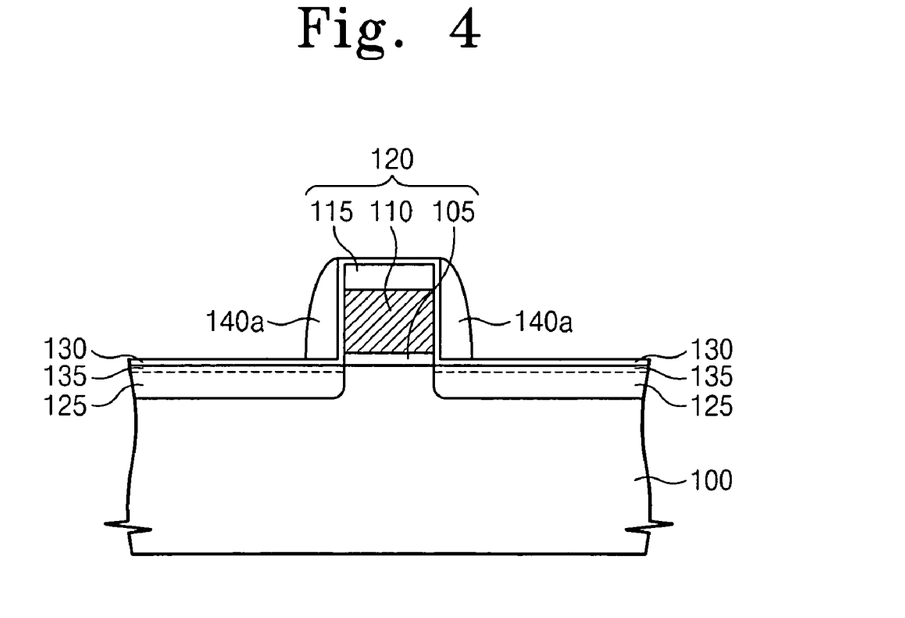
FIG. 4 is a cross-sectional view of a semiconductor device according to further embodiments of the present invention.

FIG. 4 is a cross-sectional view of a semiconductor device according to further embodiments of the present invention. Referring now to FIG. 4, a lightly doped layer 125 is disposed below a gate spacer 140a on a sidewall of the gate pattern 120. A surface insulation layer 130 is sandwiched between the lightly doped layer 125 and the gate spacer 140a. A carrier accumulating layer 135 is formed at an upper portion of the lightly doped layer 125 due to the interfacial states at the interface between the surface insulation layer 130 and the lightly doped layer 125.

The surface insulation layer 130, the carrier accumulating layer 135, and the lightly doped layer 125 extend along the surface of the substrate 100 away from the gate pattern 120. The carrier accumulating layer 135 and the lightly doped layer 125 form source/drain regions for a MOS transistor.

The MOS transistor may be included in a unit cell of a DRAM device. If a contact plug (not shown) is formed to electrically connect with a source/drain region (including the lightly doped layer 125 and the carrier accumulating layer 135), it may be coupled with the lightly doped layer 125 through the surface insulation layer 130. The carrier accumulating layer 135 may be connected to a lateral face of the contact plug.

Figure 5:
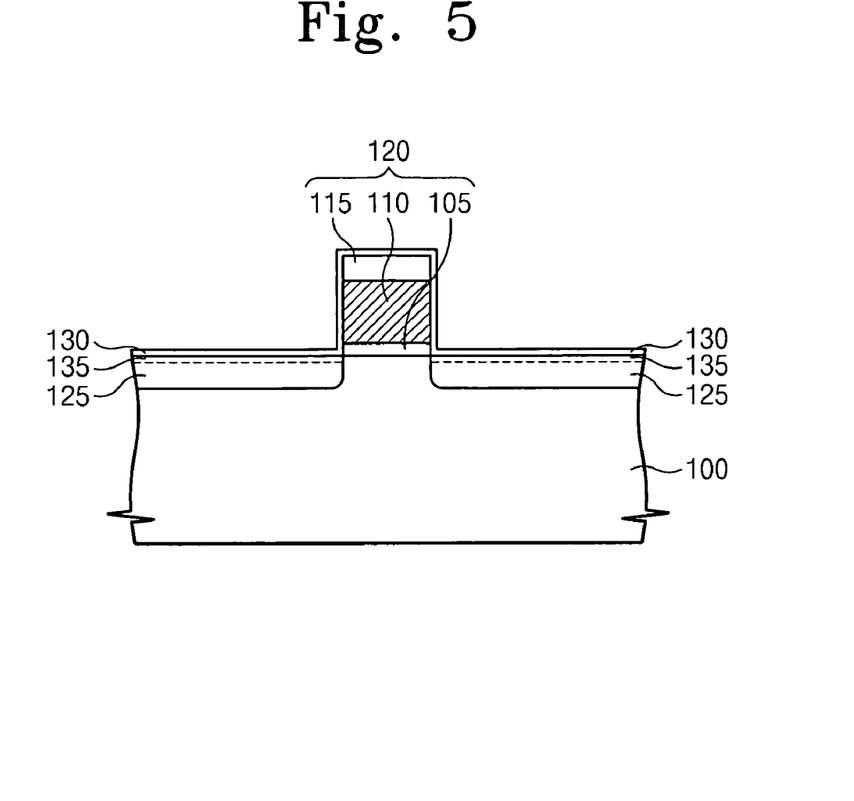
FIGS. 5-7 are cross-sectional views illustrating exemplary intermediate fabrication steps in methods for forming a semiconductor device according to some embodiments of the present invention.

Methods for forming a semiconductor device according to some embodiments of the present invention will now be described with reference to FIG. 5 through FIG. 7. Referring now to FIG. 5, a gate pattern 120 is formed on a semiconductor substrate 100 that has been doped with impurities of a first conductive type. The gate pattern 120 includes a gate insulation layer 105, a gate electrode 110, and a capping pattern 115, which are sequentially stacked. The gate insulation layer 105, the gate electrode 110, and the capping pattern 115 may be formed of the materials previously described with reference to FIG. 2.

Using the gate pattern 120 as a mask, impurities of a second conductive type are implanted, at a relatively low dose, into the substrate 100 at opposite sides of and adjacent to the gate pattern 120 to form a lightly doped layer 125. The impurities in the lightly doped layer 125 have a different conductive type than the impurities in the substrate 100.

Still referring to FIG. 5, a top/upper surface of the lightly doped layer 125 (i.e., a surface of the substrate 100 at the opposite sides of and adjacent to the gate pattern 120) is exposed. A native oxide layer and/or a buffer oxide layer for ion implantation may be formed on the surface of the substrate 100 at the opposite sides of the gate pattern 120. The native oxide layer and/or the buffer oxide layer may be removed using a cleaning process.

A surface insulation layer 130 is conformally formed on the surface of the substrate 100. The surface insulation layer 130 is in direct contact with the substrate 100 (i.e., the top/upper surface of the lightly doped layer 125) at the opposite sides of and adjacent to the gate pattern 120. The surface insulation layer 130 is formed of a material selected to lead to the presence of interfacial states at an interface between the surface insulation layer 130 and the substrate 100. The surface insulation layer 130 has a relatively small thickness ranging from about several angstroms to about several dozen angstroms. The interfacial states may induce majority carriers in the lightly doped layer 125 to form a carrier accumulating layer 135 at an upper portion of the lightly doped layer 125. The carrier accumulating layer 135 is formed directly below the surface of the substrate 100.

For example, where the substrate 100 is doped with P-type impurities and the lightly doped layer 125 is doped with N-type impurities, the surface insulation layer 130 may be formed of a material that may lead to the presence of the interfacial states and thereby induce electrons to form the carrier accumulation layer 135. The surface insulation layer 130 may include, for example, hafnium-rich hafnium oxide, zirconium-rich zirconium oxide, and/or silicon nitride. The formation of a hafnium-rich hafnium oxide layer and/or a zirconium-rich zirconium oxide layer may be accomplished by means of a chemical vapor deposition (CVD) process and/or an atomic layer deposition (ALD) process. The formation of a silicon nitride layer may be accomplished by a CVD process, an ALD process, a rapid thermal nitridation process, and/or a plasma nitridation process.

On the other hand, where the substrate 100 is doped with N-type impurities and the lightly doped layer 125 is doped with P-type impurities, the surface insulation layer 130 may be formed of a material selected to lead to the presence of interfacial states that may induce holes to form the carrier accumulation layer 135. The surface insulation layer 130 may be formed of aluminum-rich aluminum oxide. The formation of the aluminum-rich aluminum oxide layer may be accomplished by a CVD process and/or an ALD process.

Figure 6:
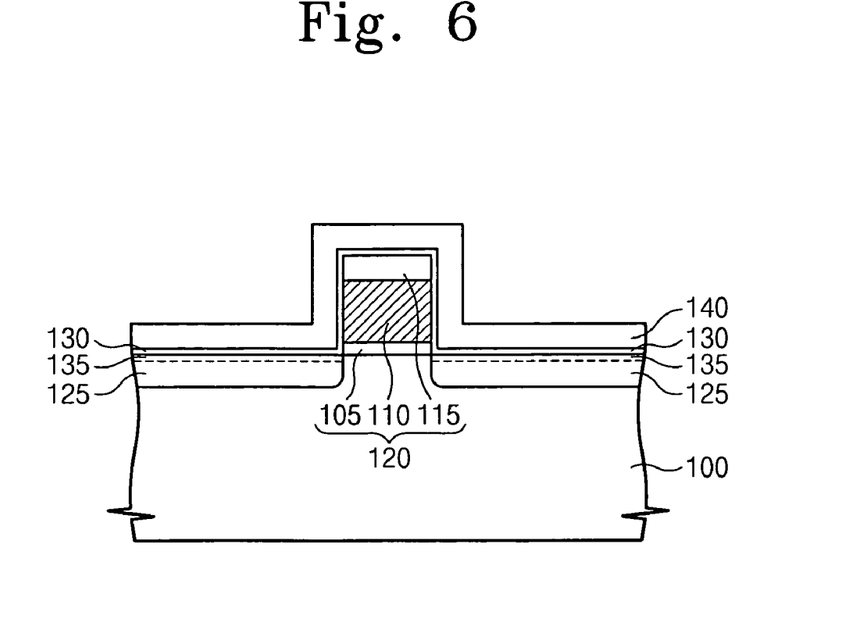

Referring now to FIG. 6, a spacer layer 140 is conformally formed on the surface of the semiconductor substrate 100 including the surface insulation layer 130. The spacer layer 140 may be formed of an insulating material having a lower dielectric constant than silicon nitride. Additionally, the spacer layer 140 may be formed of an insulating material having the same dielectric constant as silicon oxide or a lower dielectric constant than silicon oxide. The spacer layer 140 may include, for example, silicon oxide, silicon carbide, and/or silicon oxycarbide.

Figure 7:
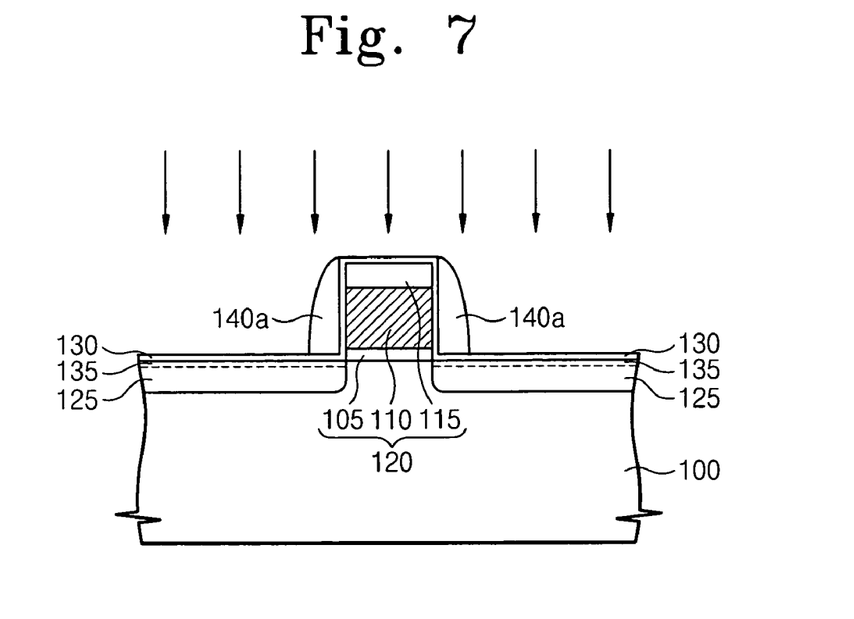

Referring now to FIG. 7, the spacer layer 140 is anisotropically etched to form a gate spacer 140a on both sidewalls of the gate pattern 120. Using the gate pattern 120 and the gate spacer 140a as a mask, impurities of the second conductive type are implanted at a relatively high dose to form a heavily doped layer 145 of FIG. 2. The impurities in the heavily doped layer 145 have the same conductive type as the impurities in the lightly doped layer 125. The dose used to form the heavily doped layer 145 is higher than the dose used to form the lightly doped layer 125. The heavily doped layer 145 is formed to a greater depth than the lightly doped layer 125, to provide the semiconductor device illustrated in FIG. 2.

However, the process of implanting the impurities of the second conductive type at the high dose may be omitted to provide the semiconductor device illustrated in FIG. 4.

Other embodiments of the present invention provide a lightly doped layer having a surface insulation layer and a carrier accumulating layer for use in a flash memory cell, as will be described below with reference to FIGS. 8 through 11. Elements referred to by the same reference designators as the above embodiments may have similar functions and/or operations.

Figure 8:
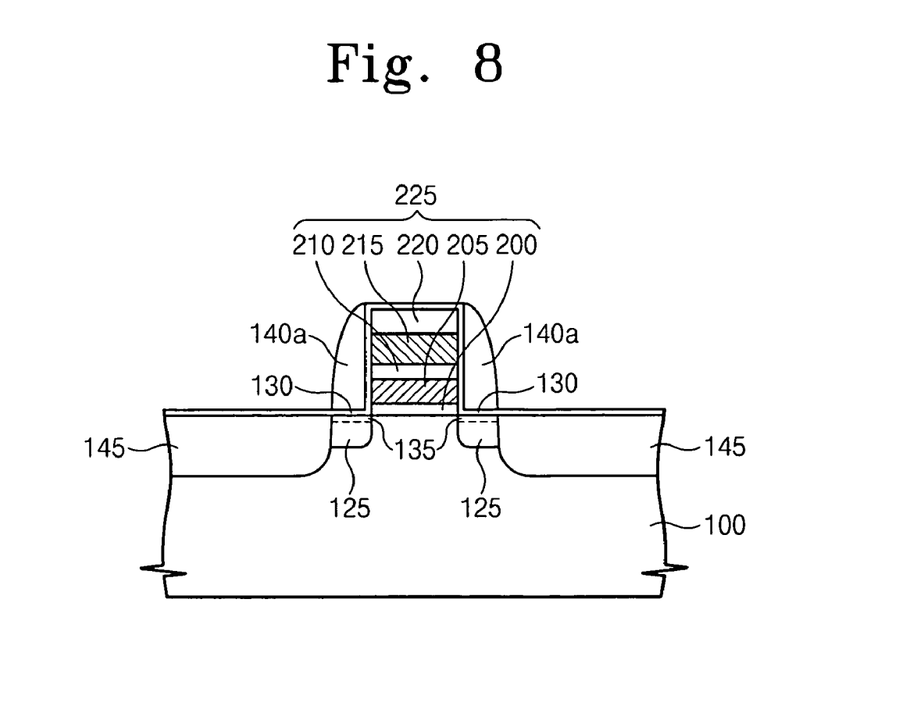
FIG. 8 is a cross-sectional view of a semiconductor device according to other embodiments of the present invention.
Figure 9:
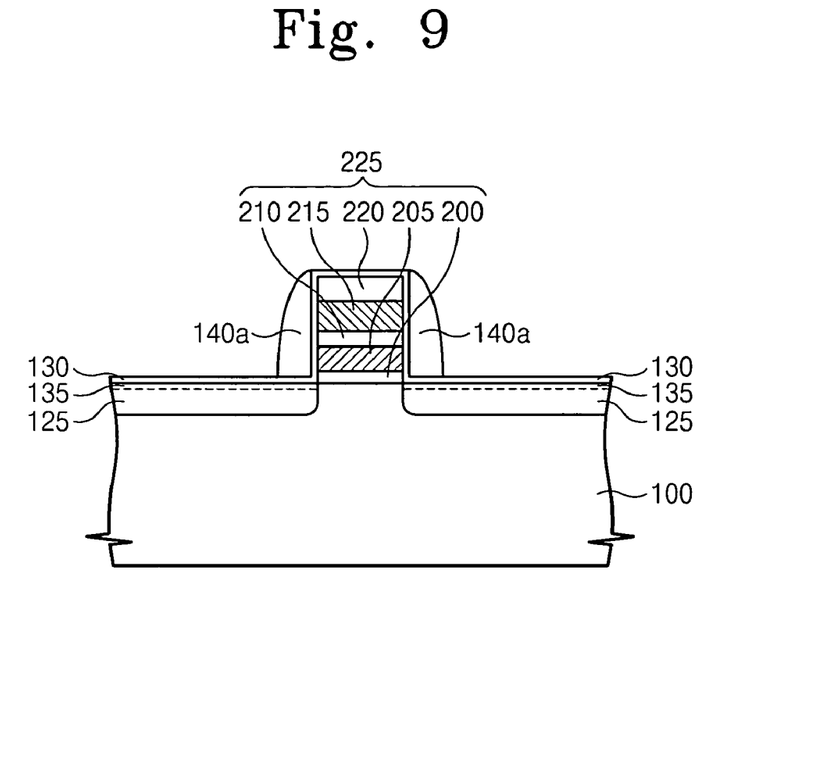
FIG. 9 is a cross-sectional view of a semiconductor device according to still other embodiments of the present invention.

FIG. 8 is a cross-sectional view of a semiconductor device according to other embodiments of the present invention, and FIG. 9 is a cross-sectional view of a semiconductor device according to still other embodiments of the present invention.

Referring now to FIG. 8, a gate pattern 225 is disposed on a semiconductor substrate 100 doped with impurities of a first conductive type, for example, p-type impurities. The gate pattern 225 includes a tunnel insulation layer 200, a charge storage pattern 205, a blocking insulation layer 210, a control gate electrode 215 and a capping pattern 220, which are sequentially stacked.

The tunnel insulation layer 200 may be formed of thermal oxide. The charge storage pattern 205 is a region in which charges may be stored. More specifically, the charge storage pattern 205 may be a floating gate that is configured to store charges. Therefore, the charges stored in the floating gate may be free-charges. As such, the charge storage pattern 205 may be formed of polysilicon. In addition, the charge storage pattern 205 may be a charge trapping layer having relatively deep-level traps to trap charges. Accordingly, the charge storage pattern 205 may be formed of silicon nitride. The blocking insulation layer 210 may interrupt migration of charges between the charge storage pattern 205 and the control gate electrode 215. The blocking insulation layer 210 may be formed of silicon oxide, oxide-nitride-oxide (ONO), and/or a high-k dielectric. The high-k dielectric may have a higher dielectric constant than silicon nitride. The high k-dielectric may be a metal oxide, such as aluminum oxide and/or hafnium oxide. The capping pattern 220 may be an insulation layer formed of silicon oxide, silicon nitride, and/or silicon oxynitride.

The gate spacer 140a is disposed on opposing sidewalls of the gate pattern 225, and a lightly doped layer 125 is formed in the substrate 100 below the gate spacer 140a. A surface insulation layer 130 is sandwiched between the gate spacer 140a and the substrate 100. The surface insulation layer 130 is in direct contact with a surface of the substrate 100, and may lead to the presence of interfacial states at an interface between the surface insulation layer 130 and the substrate 100. The surface insulation layer 130 may extend on sidewalls and/or on an upper surface of the gate pattern 225, and may be sandwiched between the gate pattern 225 and the gate spacer 140a. The surface insulation layer 130 may cover a top surface of the gate pattern 225.

The interfacial states that may result from the surface insulation layer 130 may induce majority carriers of the lightly doped layer 125 to form a carrier accumulating layer 135 at an upper portion of the lightly doped layer 125. The carrier accumulating layer 135 may be formed directly below the surface of the substrate 100. The carrier density of the carrier accumulating layer 135 may be much higher than that of the other portions of the lightly doped layer 125. Thus, an electric resistance of the carrier accumulating layer 135 may be significantly reduced.

The surface insulation layer 130 may be formed of the same materials as described in the above embodiments. As such, if the substrate 100 is doped with P-type impurities and the lightly doped layer 125 is doped with N-type impurities, the surface insulation layer 130 may lead to the presence of interfacial states that may induce electrons to form the carrier accumulating layer 135. In this case, the surface insulation layer 130 may be formed of hafnium-rich hafnium oxide, zirconium-rich zirconium oxide, and/or silicon nitride. Thus, the electrons may be accumulated in the carrier accumulating layer 135.

However, if the semiconductor substrate 100 is doped with N-type impurities and the lightly doped layer 125 is doped with P-type impurities, the surface insulation layer 130 may lead to the presence of interfacial states that may induce holes to form the carrier accumulating layer 135. In this case, the surface insulation layer 130 may be formed of aluminum-rich aluminum oxide. Thus, the holes 135 may be accumulated in the carrier accumulating layer 135.

The gate spacer 140a may be formed of the same materials as described in the above embodiments. As such, the gate spacer 140a may be formed of an insulating material having a lower dielectric constant than silicon nitride. Additionally, the gate spacer 140a may be formed of an insulating material having the same dielectric constant as silicon oxide or a lower dielectric than silicon oxide. The gate spacer 140a may be formed of, for example, silicon oxide, silicon carbide, and/or silicon oxycarbide.

A heavily doped layer 145 is formed in the semiconductor substrate 100 at one side of the lightly doped layer 225. Thus, the lightly doped layer 125 is between the gate pattern and the heavily doped layer 145. The heavily doped layer 145 is doped with impurities of the same conductive type as the impurities implanted into the lightly doped layer 125. The heavily doped layer 145 has a higher impurity concentration than the lightly doped layer 125. The lightly doped layer 125 has a shallower junction than the heavily doped layer 145. The lightly doped layer 125 and the heavily doped layer 145 (including the carrier accumulating layer 135) form source/drain regions in the substrate 100 at opposite sides of the gate pattern 225.

The gate pattern 225, a channel region below the gate pattern 225, and the source/drain regions form a flash memory cell. Accordingly, charges may be stored in the charge storage pattern 205 by means of Fowler-Nordheim tunneling (FN tunneling) or hot carrier injection. The flash memory cell may be used in NAND-type flash memory devices or NOR-type flash memory devices.

Still other embodiments of the present invention are illustrated in FIG. 9. Referring to FIG. 9, the source/drain regions of the flash memory cell may include the lightly doped layer 125 (including the carrier accumulating layer 135) without the heavily doped layer. In other words, the heavily doped layer may not be formed. In this case, the surface insulation layer 130, the carrier accumulating layer 135, and the lightly doped layer 125 extend along the surface of the substrate 100 in a direction opposite to the gate pattern 225. The flash memory cell may be programmed by means of FN tunneling or hot carrier injection, and may be used in NAND-type flash memory devices or NOR-type flash memory devices.

Methods for forming a semiconductor device according to other embodiments of the present invention will now be described with reference to FIG. 10 and FIG. 11.

Figure 10:
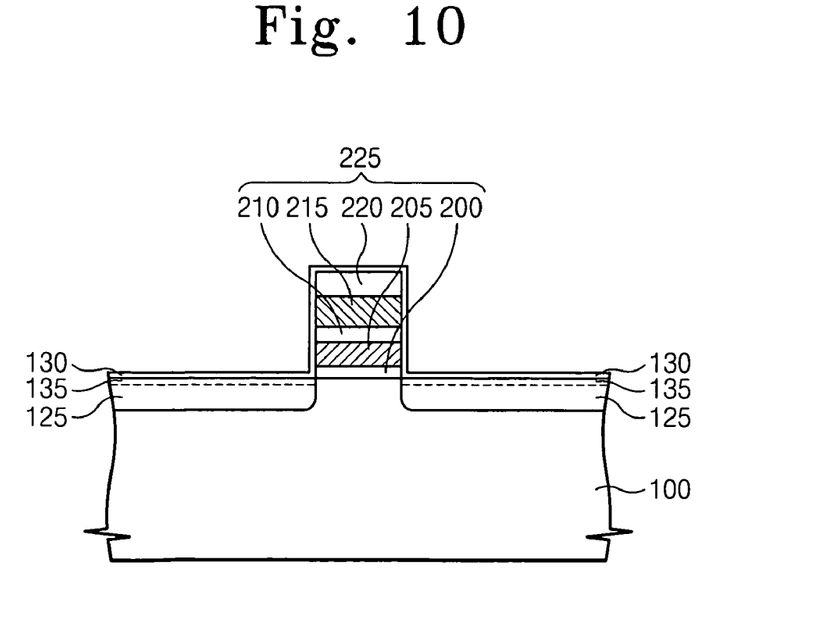
FIGS. 10-11 are cross-sectional views illustrating exemplary intermediate fabrication steps in methods for forming a semiconductor device according to other embodiments of the present invention.

Referring now to FIG. 10, a gate pattern 225 is formed on a semiconductor substrate 100 doped with impurities of a first conductive type. The gate pattern 225 includes a tunnel insulation layer 200, a charge storage pattern 205, a blocking insulation layer 210, a control gate electrode 215, and a capping pattern 220 that are sequentially stacked. The gate pattern 225 is a portion of a flash memory cell. Using the gate pattern 225 as a mask, impurities of a second conductive type are implanted at a relatively low dose to form a lightly doped layer 125 in the substrate 100 at opposite sides of and adjacent to the gate pattern 225.

A surface of the substrate 100 at opposite sides of the gate pattern 225, (i.e., a top/upper surface of the lightly doped layer 125) is exposed. The exposure of the substrate 100 may be accomplished by a cleaning process for removing a native oxide layer and/or a buffer oxide layer for ion implantation.

A surface insulation layer 130 is formed on an entire surface of the substrate 100. The surface insulation layer 130 is in direct contact with the exposed portion of the substrate 100. The surface insulation layer 130 may be similar in materials and/or methods of formation as the surface insulation layer described in the above with reference to earlier embodiments.

The surface insulation layer 130 may lead to the presence of interfacial states at an interface between the surface insulation layer 130 and the substrate 100. A carrier accumulating layer 135 (which may be induced by the interfacial states) is formed at an upper portion of the lightly doped layer 125.

Figure 11:
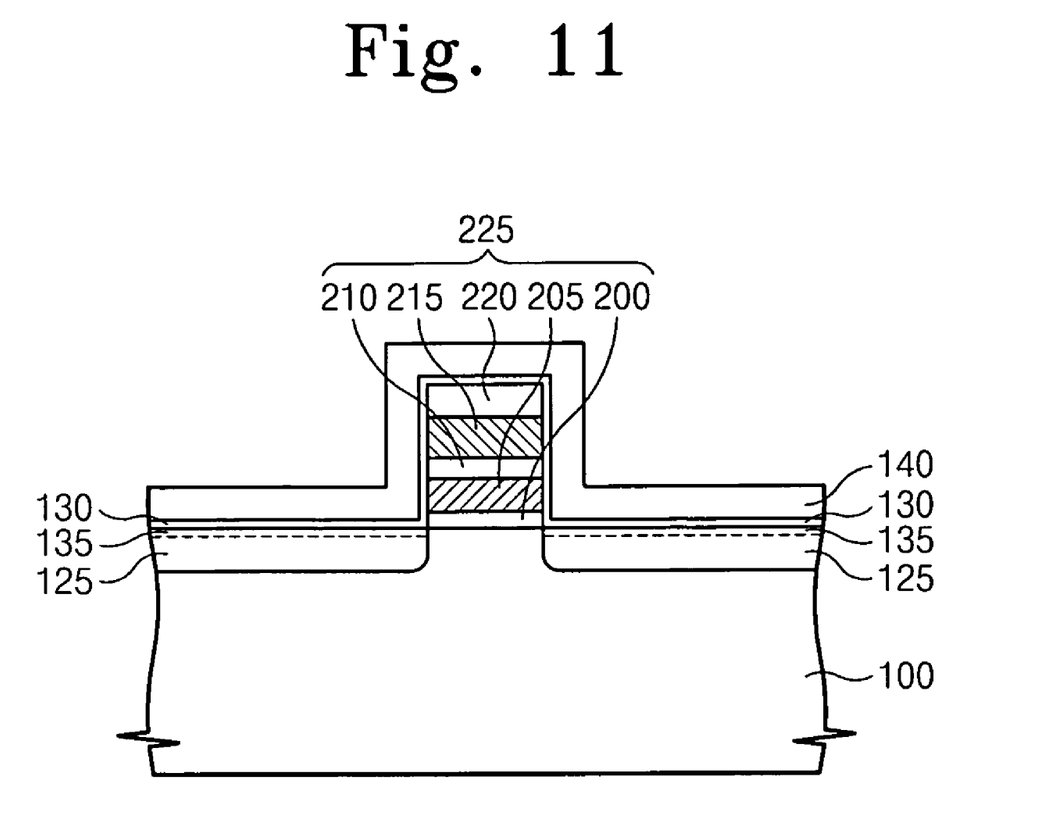

Referring now to FIG. 11, a spacer layer 140 is conformally formed on the surface of the semiconductor substrate 100. The spacer layer 140 may be formed of similar materials as described above with reference to earlier embodiments.

The spacer layer 140 is isotropically etched to form a gate spacer 140*a* in FIG. 8 and FIG. 9. As a result, the semiconductor device shown in FIG. 9 may be provided.

In addition, using the gate pattern 225 and the gate spacer 140*a* as a mask, impurities of a second conductive type may be implanted to form the heavily doped layer 145 shown in FIG. 8. As a result, the semiconductor device of FIG. 8 may be provided.

According to some embodiments of the present invention, a surface insulation layer, which is direct contact with a semiconductor substrate, may lead to the presence of interfacial states at an interface between the surface insulation layer and the substrate. The interfacial states may induce majority carriers in the lightly doped layer to form a carrier accumulating layer at an upper portion of the lightly doped layer. Due to the increased carrier concentration in the carrier accumulating layer, a resistance of the lightly doped layer may be reduced, thereby increasing the on-current of the semiconductor device. As a result, the semiconductor device having higher operating speeds may be provided.

In addition, since the on-current may be increased due to the carrier accumulating layer, an impurity concentration of the lightly doped layer may be reduced, which may reduce and/or suppress short channel effects. Therefore, it may be possible to simultaneously prevent degradation of device characteristics and increase device operating speed. Since the gate spacer may be formed of an insulating material having a relatively low dielectric constant, parasitic capacitance of the semiconductor device may also be reduced to prevent degradation of device characteristics.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

That which is claimed:

1. A semiconductor device comprising:
a gate pattern disposed on a semiconductor substrate doped with impurities of a first conduction type;
a gate spacer disposed on both sidewalls of the gate pattern;
a surface insulation layer sandwiched between the gate spacer and the semiconductor substrate to contact the semiconductor substrate and configured such that an interface between the surface insulation layer and the semiconductor substrate includes a plurality of interfacial states;
a lightly doped layer doped with impurities of a second conduction type and disposed in the semiconductor substrate below the gate spacer; and
a carrier accumulating layer disposed at an upper portion of the lightly doped layer and having a greater carrier concentration than other portions thereof,
wherein the interfacial states induce majority carriers in the lightly doped layer to accumulate along the interface to define the carrier accumulating layer.

2. The device of claim 1, wherein the gate pattern comprises a gate insulation layer and a gate electrode which are sequentially stacked on the semiconductor substrate.

3. The device of claim 2, further comprising:
a heavily doped layer disposed in the semiconductor substrate at one side of the lightly doped layer, the lightly doped layer being sandwiched between the gate pattern and the heavily doped layer,
wherein the lightly doped layer and the carrier accumulating layer are electrically connected with the heavily doped layer.

4. The device of claim 2, wherein the surface insulation layer, the carrier accumulating layer, and the lightly doped layer extend along a surface of the semiconductor substrate in an opposite direction to the gate pattern.

5. The device of claim 1, wherein the gate pattern comprises a tunnel insulation layer, a charge storage pattern, a blocking insulation layer, and a control gate electrode which are sequentially stacked on the semiconductor substrate.

6. The device of claim 5, further comprising:
a heavily doped layer disposed in the semiconductor substrate at one side of the lightly doped layer, the lightly doped layer being sandwiched between the gate pattern and the heavily doped layer,
wherein the lightly doped layer and the carrier accumulating layer are electrically connected with the heavily doped layer.

7. The device of claim 5, wherein the surface insulation layer, the carrier accumulating layer, and the lightly doped layer extend along the surface of the semiconductor substrate in an opposite direction to the gate pattern.

8. The device of claim 1, wherein the semiconductor substrate is doped with P-type impurities and the lightly doped layer is doped with N-type impurities, and the interfacial states induce electrons in the lightly doped layer.

9. The device of claim 8, wherein the surface insulation layer comprises one selected from the group consisting of hafnium-rich hafnium oxide having a hafnium concentration sufficient to provide accumulation of the electrons along the interface, zirconium-rich zirconium oxide having a zirconium concentration sufficient to provide accumulation of the electrons along the interface, and silicon nitride.

10. The device of claim 1, wherein the semiconductor substrate is doped with N-type impurities and the lightly doped layer is doped with P-type impurities, and the interfacial states induce holes in the lightly doped layer.

11. The device of claim 10, wherein the surface insulation layer comprises aluminum-rich aluminum oxide.

12. The device of claim 1, wherein the gate spacer comprises an insulating material having a lower dielectric constant than silicon nitride.

13. A semiconductor device, comprising:
a gate structure on a channel region of a semiconductor substrate adjacent to a source/drain region therein;
a surface insulation layer directly on the source/drain region of the substrate adjacent to the gate structure and configured such that an interface between the surface insulation layer and the substrate includes a plurality of interfacial states that induce majority carriers in the source/drain region to accumulate along the interface; and
a spacer on a sidewall of the gate structure adjacent to the source/drain region such that a portion of the surface insulation layer adjacent the gate structure is sandwiched between the substrate and the spacer,
wherein portions of the source/drain region immediately adjacent the interface define a carrier accumulation layer extending along the interface under the spacer and having a greater carrier concentration than other portions thereof.

14. The device of claim 13, wherein the source/drain region comprises:
   a first region adjacent the channel region; and
   a second region having a greater impurity concentration than the first region adjacent the first region opposite the channel region and extending into the substrate beyond the first region.

15. The device of claim 14, wherein the carrier accumulation layer extends away from the channel region along the interface from a portion of the first region immediately adjacent the channel region into the second region.

16. The device of claim 15, wherein portions of the carrier accumulation layer in the second region have a greater carrier concentration than portions of the carrier accumulation layer in the first region.

17. The device of claim 14, wherein the carrier accumulation layer extends away from the channel region along the interface into the first region but does not extend beyond the spacer.

* * * * *